United States Patent
Kobayashi et al.

(10) Patent No.: US 8,753,923 B2
(45) Date of Patent: Jun. 17, 2014

(54) WAFER PROCESSING METHOD

(71) Applicant: Disco Corporation, Tokyo (JP)

(72) Inventors: Satoshi Kobayashi, Tokyo (JP); Jinyan Zhao, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/788,545

(22) Filed: Mar. 7, 2013

(65) Prior Publication Data

US 2013/0183811 A1   Jul. 18, 2013

(51) Int. Cl.
*H01L 21/301*   (2006.01)
*H01L 21/304*   (2006.01)
*H01L 21/78*    (2006.01)

(52) U.S. Cl.
USPC ........... 438/113; 438/462; 438/463; 438/464; 257/E21.237; 257/E21.596; 257/E21.599

(58) Field of Classification Search
None
See application file for complete search history.

(56) References Cited

U.S. PATENT DOCUMENTS

| | | | |
|---|---|---|---|
| 2003/0013380 A1* | 1/2003 | Arai et al. | 451/6 |
| 2009/0142906 A1* | 6/2009 | Nakamura | 438/463 |
| 2009/0280622 A1* | 11/2009 | Genda et al. | 438/462 |
| 2013/0299098 A1* | 11/2013 | Maki et al. | 156/758 |

FOREIGN PATENT DOCUMENTS

| | | |
|---|---|---|
| JP | 2002-192370 | 7/2002 |
| JP | 2005-086161 | 3/2005 |

* cited by examiner

*Primary Examiner* — Zandra Smith
*Assistant Examiner* — Pamela E Perkins
(74) *Attorney, Agent, or Firm* — Greer Burns & Crain Ltd.

(57) ABSTRACT

A wafer processing method of dividing a wafer along streets. The wafer processing method includes a protective tape attaching step of attaching a protective tape to the front side of the wafer, a modified layer forming step of holding the wafer through the protective tape on a chuck table of a laser processing apparatus under suction and next applying a laser beam having a transmission wavelength to the wafer from the back side of the wafer along the streets, thereby forming a modified layer inside the wafer along each street, and a wafer dividing step of canceling suction holding of the wafer by the chuck table and next applying an air pressure to the wafer now placed on the holding surface in the condition where horizontal movement of the wafer is limited, thereby dividing the wafer along each street where the modified layer is formed, thus obtaining individual devices.

4 Claims, 14 Drawing Sheets

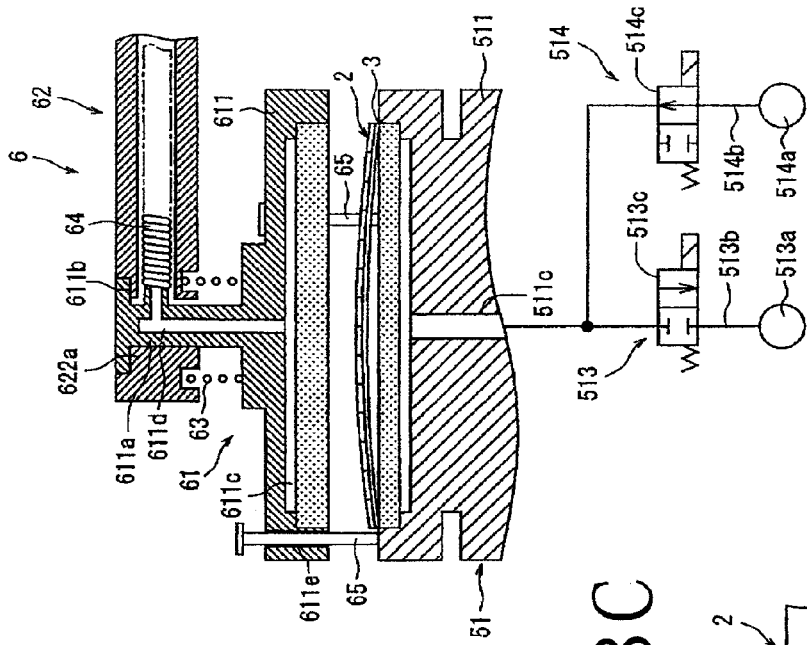
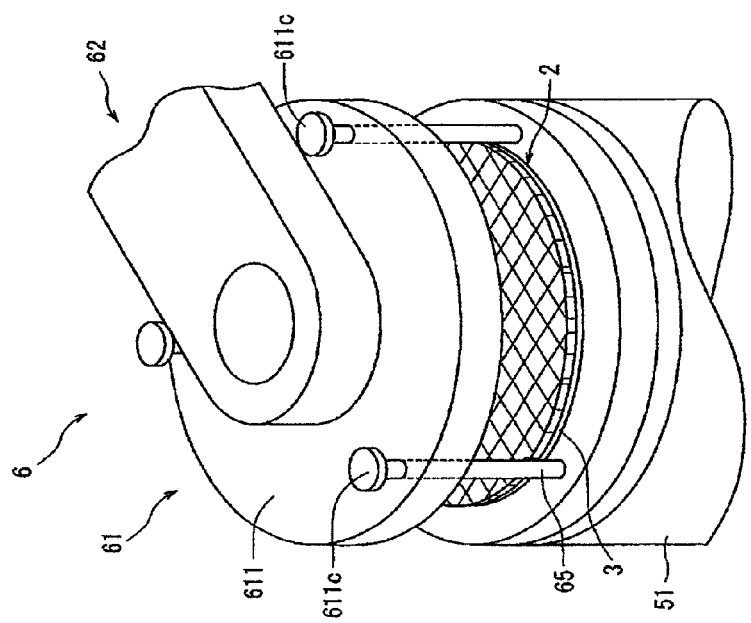

WAFER PROCESSING METHOD

BACKGROUND OF THE INVENTION

1. Field of the Invention

The present invention relates to a wafer processing method of dividing a wafer along a plurality of crossing streets formed on the front side of the wafer to thereby partition a plurality of regions where a plurality of devices are respectively formed along the streets, thus obtaining the individual devices.

2. Description of the Related Art

In a semiconductor device fabrication process, a plurality of crossing division lines called streets are formed on the front side of a substantially disk-shaped semiconductor wafer to thereby partition a plurality of regions where a plurality of devices such as ICs and LSIs are respectively formed. The semiconductor wafer is cut along the streets to thereby divide the regions where the devices are formed from each other, thus obtaining the individual devices. Further, an optical device wafer is provided by forming a gallium nitride compound semiconductor layer or the like on the front side of a sapphire substrate or a silicon carbide substrate. The optical device wafer is also cut along the streets to obtain individual optical devices divided from each other, such as light emitting diodes and laser diodes, which are widely used in electric equipment.

As a method of dividing such a wafer along the streets, there has been tried a laser processing method of applying a pulsed laser beam having a transmission wavelength to the wafer along the streets in the condition where the focal point of the pulsed laser beam is set inside the wafer in a subject area to be divided. More specifically, this wafer dividing method using laser processing includes the steps of applying a pulsed laser beam having a transmission wavelength to the wafer from one side of the wafer along the streets in the condition where the focal point of the pulsed laser beam is set inside the wafer to thereby continuously form a modified layer inside the wafer along each street and next applying an external force to the wafer along each street where the modified layer is formed to be reduced in strength, thereby dividing the wafer into the individual devices (see Japanese Patent No. 3408805, for example).

According to the wafer dividing method described in Japanese Patent No. 3408805, however, the modified layer is left on the side surface of each device after dividing the wafer, causing a problem such that the die strength of each device is reduced to cause a degradation in quality of each device. To solve this problem, there has been proposed a wafer processing method including the steps of applying a laser beam having a transmission wavelength to the wafer along the streets to thereby form a modified layer having a predetermined thickness inside the wafer along each street at a predetermined depth from the back side of the wafer, next dividing the wafer along each street where the modified layer is formed, and finally grinding the back side of the wafer to remove the modified layer (see Japanese Patent Laid-Open No. 2005-86161, for example).

SUMMARY OF THE INVENTION

In the wafer processing method disclosed in Japanese Patent Laid-Open No. 2005-86161, it is necessary to prepare a separate dividing apparatus for dividing the wafer along each street where the modified layer is formed.

It is therefore an object of the present invention to provide a wafer processing method which can divide the wafer along each street where the modified layer is formed, without using a separate dividing apparatus, and next grind the back side of the wafer to remove the modified layer.

In accordance with an aspect of the present invention, there is provided a wafer processing method of dividing a wafer along a plurality of crossing streets formed on the front side of the wafer to thereby partition a plurality of regions where a plurality of devices are respectively formed, the wafer processing method including a protective tape attaching step of attaching a protective tape to the front side of the wafer; a laser processing apparatus preparing step of preparing a laser processing apparatus including a chuck table having a holding surface for holding the wafer, the holding surface being adapted to selectively receive a vacuum and an air pressure; a modified layer forming step of placing the protective tape attached to the wafer on the holding surface of the chuck table of the laser processing apparatus, next applying the vacuum to the holding surface to thereby hold the wafer through the protective tape on the holding surface under suction, and next applying a laser beam having a transmission wavelength to the wafer from the back side of the wafer along the streets, thereby forming a modified layer inside the wafer along each street at a depth not reaching a finished thickness of each device as measured from the front side of the wafer; a wafer dividing step of canceling suction holding of the wafer by the chuck table and next applying the air pressure to the wafer now placed on the holding surface in the condition where horizontal movement of the wafer is limited, thereby dividing the wafer along each street where the modified layer is formed, thus obtaining the individual devices; and a modified layer removing step of grinding the back side of the wafer after performing the wafer dividing step to reduce the thickness of the wafer to the finished thickness of each device, thereby removing the modified layer.

Preferably, this wafer processing method further includes a preliminary grinding step of grinding the back side of the wafer after performing the protective tape attaching step and before performing the modified layer forming step to reduce the thickness of the wafer to a predetermined thickness allowing proper formation of the modified layer in the modified layer forming step.

In accordance with another aspect of the present invention, there is provided a wafer processing method of dividing a wafer along a plurality of crossing streets formed on the front side of the wafer to thereby partition a plurality of regions where a plurality of devices are respectively formed, the wafer processing method including a protective tape attaching step of attaching a protective tape to the front side of the wafer; a modified layer forming step of applying a laser beam having a transmission wavelength to the wafer from the back side of the wafer along the streets, thereby forming a modified layer inside the wafer along each street at a depth not reaching a finished thickness of each device as measured from the front side of the wafer; a grinding apparatus preparing step of preparing a grinding apparatus including a chuck table having a holding surface for holding the wafer, the holding surface being adapted to selectively receive a vacuum and an air pressure; a wafer dividing step of placing the protective tape attached to the wafer on the holding surface of the chuck table of the grinding apparatus and next applying the air pressure to the wafer placed on the holding surface in the condition where horizontal movement of the wafer is limited, thereby dividing the wafer along each street where the modified layer is formed, thus obtaining the individual devices; and a modified layer removing step of applying the vacuum to the holding surface of the chuck table of the grinding apparatus after performing the wafer dividing step to thereby hold the wafer through the protective tape on the holding surface under suction and next grinding the back side of the wafer to reduce the thickness of the wafer to the finished thickness of each device, thereby removing the modified layer.

Preferably, this wafer processing method further includes a preliminary grinding step of grinding the back side of the wafer after performing the protective tape attaching step and before performing the modified layer forming step to reduce the thickness of the wafer to a predetermined thickness allowing proper formation of the modified layer in the modified layer forming step.

In the present invention, the modified layer forming step is performed by applying the laser beam having a transmission wavelength to the wafer from the back side of the wafer along the streets, thereby forming the modified layer inside the wafer along each street at the depth not reaching the finished thickness of each device as measured from the front side of the wafer. Thereafter, the wafer dividing step is performed by applying the air pressure to the wafer on the chuck table of the laser processing apparatus used in performing the modified layer forming step or on the chuck table of the grinding apparatus to be used in performing the modified layer removing step, in the condition where horizontal movement of the wafer is limited, thereby dividing the wafer along each street where the modified layer is formed, thus obtaining the individual devices. Accordingly, after the modified layer having a predetermined thickness is formed inside the wafer along each street at a predetermined depth from the back side of the wafer, the wafer can be reliably divided along each street where the modified layer is formed, without using a separate dividing apparatus.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 8A to 8C are views for illustrating the wafer dividing step;

DETAILED DESCRIPTION OF THE PREFERRED EMBODIMENTS

Figure 1:
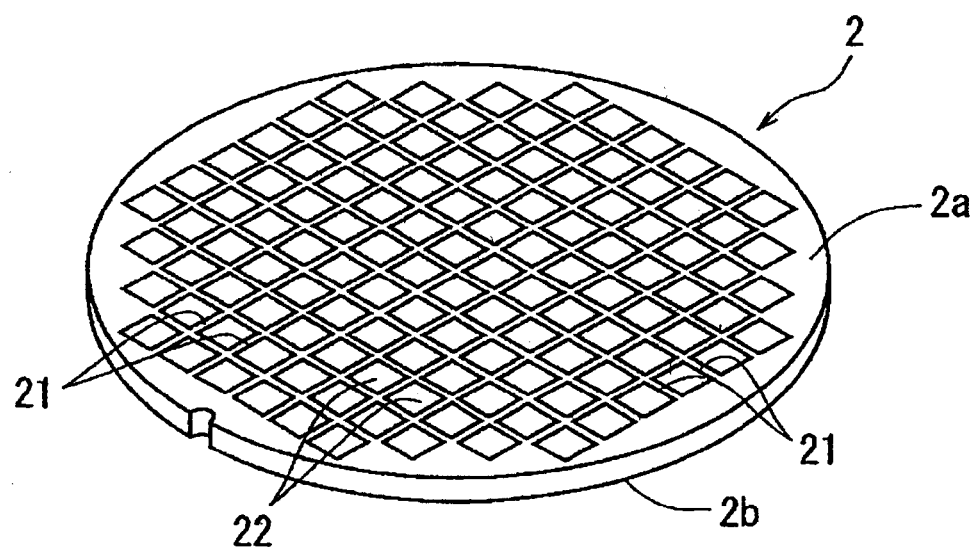
FIG. 1 is a perspective view of a semiconductor wafer as a wafer to be divided by the wafer processing method according to the present invention.

A preferred embodiment of a wafer processing method according to the present invention will now be described in detail with reference to the attached drawings. FIG. 1 is a perspective view of a semiconductor wafer 2 as a wafer to be processed by the method of the present invention. The semiconductor wafer 2 shown in FIG. 1 is formed from a silicon wafer having a thickness of 600 μm, for example. A plurality of crossing streets 21 are formed on a front side 2a of the semiconductor wafer 2 to thereby partition into a plurality of rectangular regions where a plurality of devices 22 such as ICs and LSIs are respectively formed. There will now be described the wafer processing method of dividing the semiconductor wafer 2 along the streets 21 to obtain the individual devices 22.

Figure 2A:
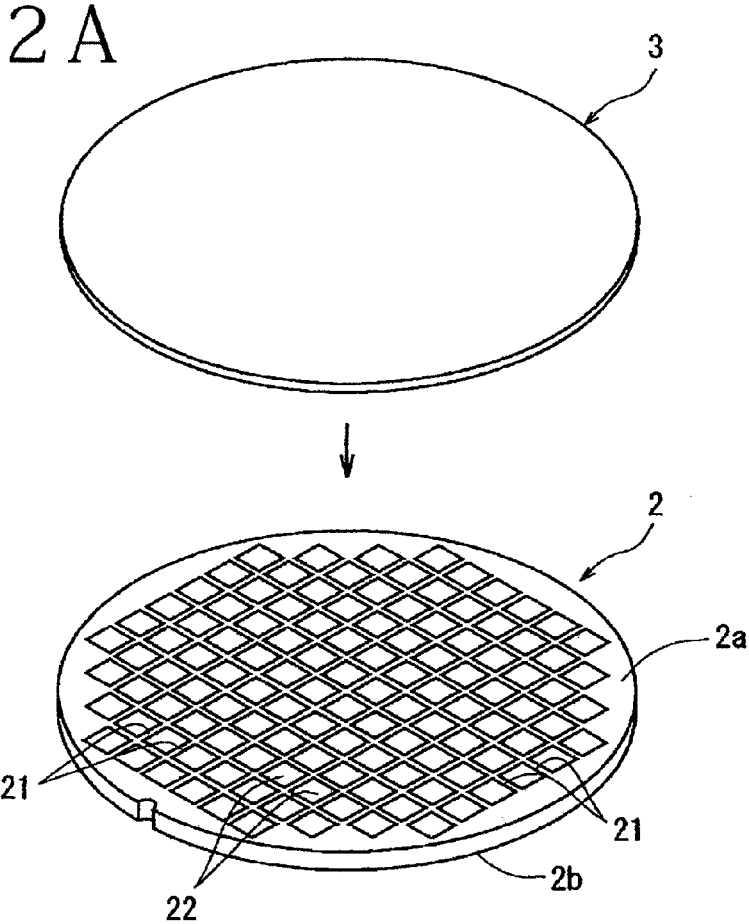
FIGS. 2A and 2B are perspective views for illustrating a protective tape attaching step in the wafer processing method according to the present invention.
Figure 2B:
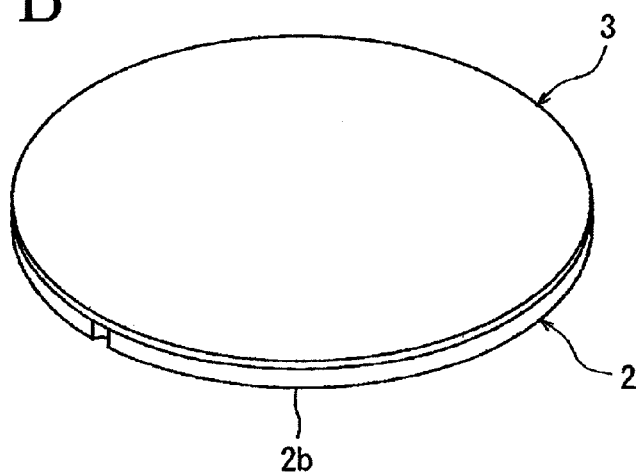

First, a protective member attaching step is performed in such a manner that a protective member is attached to the front side 2a of the semiconductor wafer 2 to protect the devices 22 formed on the front side 2a of the semiconductor wafer 2. More specifically, as shown in FIGS. 2A and 2B, a protective tape 3 as the protective member is attached to the front side 2a of the semiconductor wafer 2. The protective tape 3 is composed of a base sheet and an adhesive layer formed on the base sheet by coating. The base sheet is formed of polyvinyl chloride (PVC) and has a thickness of 100 μm, for example. The adhesive layer is formed of acrylic resin and has a thickness of about 5 μm, for example.

After performing the protective member attaching step mentioned above, a preliminary grinding step is performed in such a manner that the protective member attached to the front side 2a of the semiconductor wafer 2 is held on a chuck table of a grinding apparatus and a back side of the semiconductor wafer 2 is next ground to reduce the thickness of the semiconductor wafer 2 to a predetermined thickness allowing proper formation of a modified layer in a modified layer forming step to be hereinafter described. This preliminary grinding step is performed by using a grinding apparatus 4 shown in FIG. 3. The grinding apparatus 4 shown in FIG. 3 includes a chuck table 41 for holding a workpiece and grinding means 42 for grinding the workpiece held on the chuck table 41. The chuck table 41 has an upper surface for holding the workpiece under suction and is rotatable by a rotational driving mechanism (not shown) in the direction shown by an arrow 41a in FIG. 3. The grinding means 42 includes a spindle housing 421, a rotating spindle 422 rotatably supported in the spindle housing 421 and rotatable by a rotational driving mechanism (not shown), a mounter 423 fixed to a lower end of the rotating spindle 422, and a grinding wheel 424 mounted on a lower surface of the mounter 423. The grinding wheel 424 is composed of an annular base 425 and a plurality of abrasive members 426 fixed to a lower surface of the annular base 425 so as to be arranged annularly. The annular base 425 is mounted to the lower surface of the mounter 423 by a plurality of bolts 427.

Figure 3:
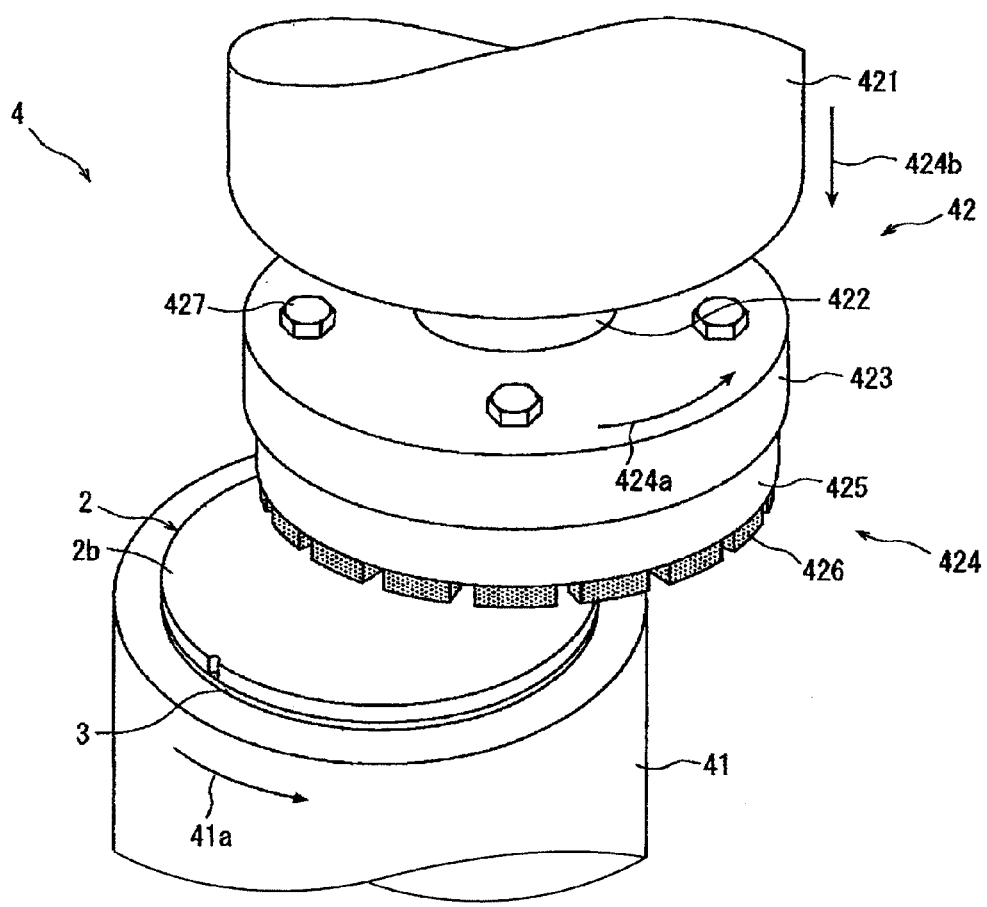
FIG. 3 is a perspective view of an essential part of a grinding apparatus for performing a preliminary grinding step in the wafer processing method according to the present invention.
Figure 4:
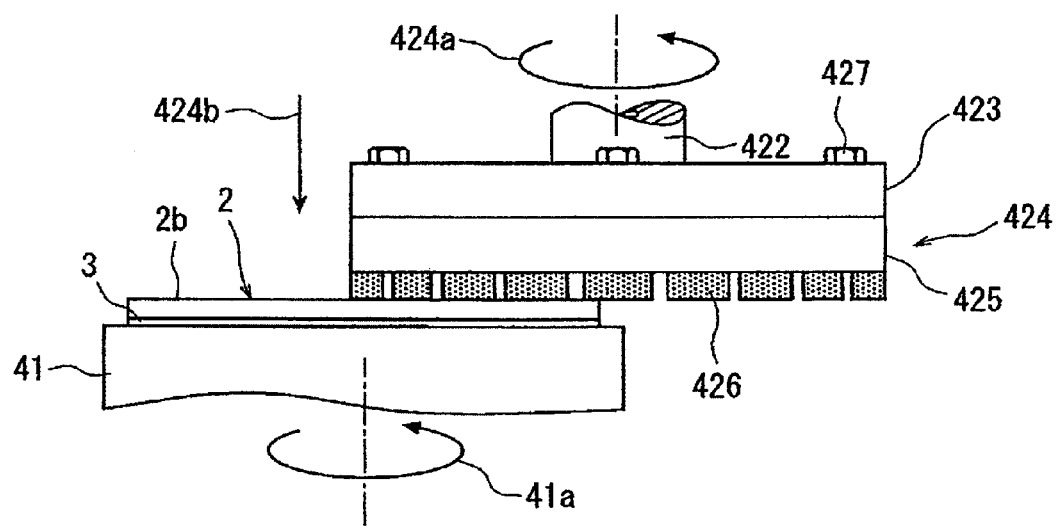
FIG. 4 is a side view for illustrating the preliminary grinding step.

The preliminary grinding step using the grinding apparatus 4 is performed in the following manner. First, the semiconductor wafer 2 is placed on the chuck table 41 in the condition where the protective tape 3 attached to the front side 2a of the semiconductor wafer 2 comes into contact with the upper surface (holding surface) of the chuck table 41 as shown in FIG. 3. Thereafter, suction means (not shown) is operated to hold the semiconductor wafer 2 through the protective tape 3 on the chuck table 41 under suction (wafer holding step). Accordingly, a back side 2b of the semiconductor wafer 2 held on the chuck table 41 is oriented upward. In the condition where the semiconductor wafer 2 is held under suction on the chuck table 41 through the protective tape 3 as mentioned above, the chuck table 41 is rotated at 300 rpm, for example, in the direction shown by the arrow 41a in FIG. 3. At the same time, the grinding wheel 424 of the grinding means 42 is also rotated at 6000 rpm, for example, in the direction shown by an arrow 424a in FIG. 3. Thereafter, the grinding means 42 is lowered to bring the abrasive members 426 into contact with the back side 2b of the semiconductor wafer 2 as a work surface as shown in FIG. 4. Further, the grinding, wheel 424 is fed downward (in the direction perpendicular to the holding surface of the chuck table 41) as shown by an arrow 424b in FIGS. 3 and 4 by a predetermined amount at a predetermined feed speed of 1 μm/s, for example. As a result, the back side 2b of the semiconductor wafer 2 is ground to reduce the thickness of the semiconductor wafer 2 to a predetermined thickness (e.g., 100 μm).

After performing the preliminary grinding step mentioned above, the modified layer forming step is performed in such a manner that the protective member attached to the semiconductor wafer 2 processed by the preliminary grinding step is held on a chuck table of a laser processing apparatus and a laser beam having a transmission wavelength to the semiconductor wafer 2 is next applied from the back side of the semiconductor wafer 2 along the streets in the condition where the focal point of the laser beam is set inside the semiconductor wafer 2, thereby forming a modified layer inside the semiconductor wafer 2 along each street at a depth not reaching a finished thickness of each device as measured from the front side of the wafer 2. This modified layer forming step is performed by using a laser processing apparatus 5 shown in FIGS. 5A and 5B. The laser processing apparatus 5 includes a chuck table 51 for holding a workpiece, laser beam applying means 52 for applying a laser beam to the workpiece held on the chuck table 51, and imaging means 53 for imaging the workpiece held on the chuck table 51.

Figure 5A:
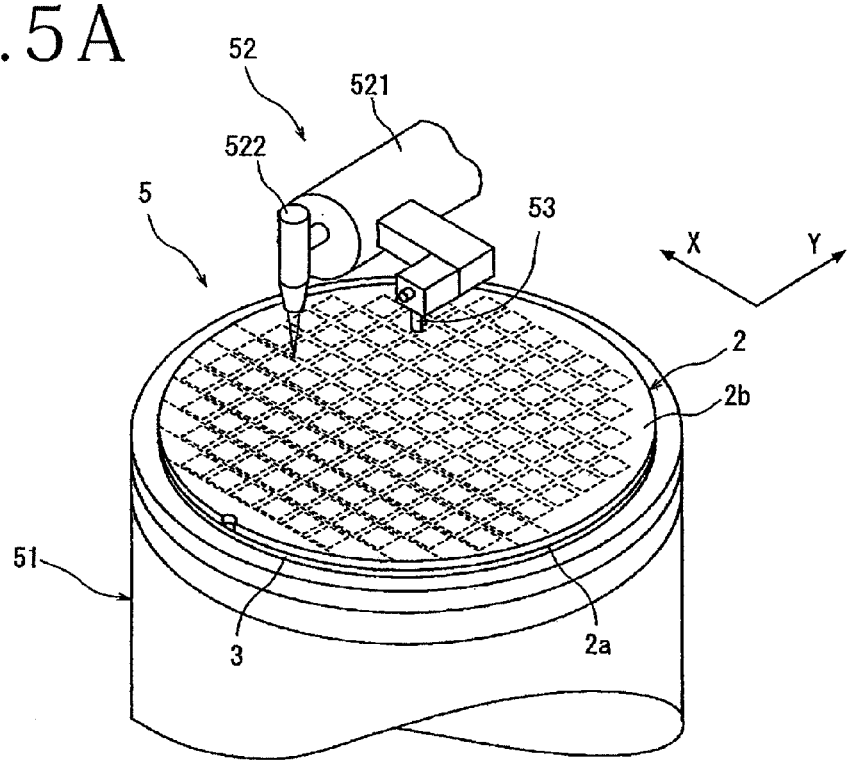
FIG. 5A is a perspective view of an essential part of a laser processing apparatus for performing a modified layer forming step in the wafer processing method according to the present invention.
Figure 5B:
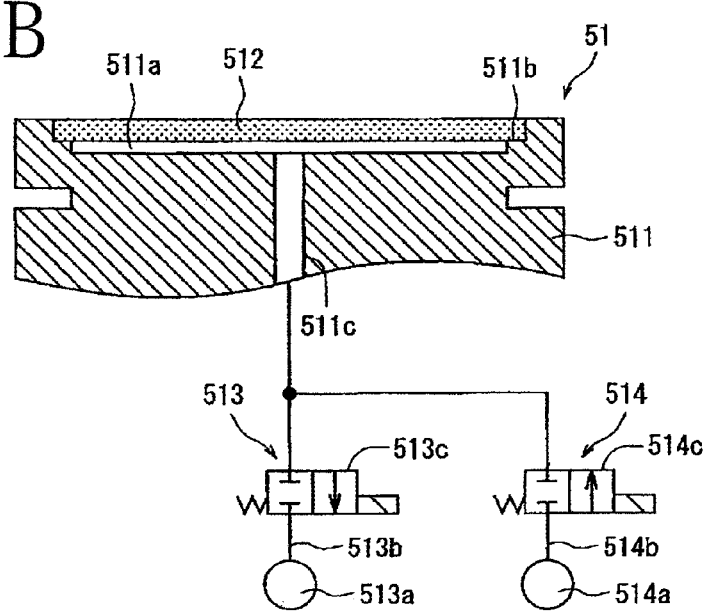
FIG. 5B is a schematic sectional view of a chuck table constituting the laser processing apparatus shown in FIG. 5A.

As shown in FIG. 5B, the chuck table 51 is composed of a solid cylindrical body 511 and a vacuum chuck 512 provided on an upper surface of the body 511. The vacuum chuck 512 is formed from a porous ceramic member having air permeability. The body 511 is formed of a metal material such as stainless steel. The upper surface of the body 511 is formed with a circular engaging recess 511a for engaging the vacuum chuck 512. An outer circumference of a bottom surface of the engaging recess 511a is formed with an annular mounting portion 511b for mounting the vacuum chuck 512 thereon. Further, the body 511 is formed with a passage 511c opening to the engaging recess 511a. The passage 511c of the body 511 of the chuck table 51 is connected to suction means 513 and compressed air supplying means 514. The suction means 513 is composed of a vacuum source 513a, a pneumatic line 513b for connecting the vacuum source 513a and the passage 511c, and an electromagnetic on-off valve 513c provided in the pneumatic line 513b. When the electromagnetic on-off valve 513c is in a de-energized condition (OFF), the valve 513c is kept closed, whereas when energized (ON), the valve 513c is opened. Accordingly, when the electromagnetic on-off valve 513c is energized (ON) to be opened, a vacuum is applied from the vacuum source 513a through the pneumatic line 513b, the passage 511c, and the engaging recess 511a to an upper surface (holding surface) of the vacuum chuck 512, thereby holding the workpiece on the upper surface (holding surface) of the vacuum chuck 512 under suction.

On the other hand, the compressed air supplying means 514 is composed of a compressed air source 514a, a pneumatic line 514b for connecting the compressed air source 514a and the passage 511c, and an electromagnetic on-off valve 514c provided in the pneumatic line 514b. When the electromagnetic on-off valve 514c is in a de-energized condition (OFF), the valve 514c is kept closed, whereas when energized (ON), the valve 514c is opened. Accordingly, when the electromagnetic on-off valve 514c is energized (ON) to be opened, an air pressure is applied from the compressed air source 514a through the pneumatic line 514b, the passage 511c, and the engaging recess 511a to the upper surface (holding surface) of the vacuum chuck 512, thereby applying the air pressure to the workpiece placed on the upper surface (holding surface) of the vacuum chuck 512. Further, the chuck table 51 is movable by a moving mechanism (not shown) in a feeding direction shown by an arrow X in FIG. 5A and in an indexing direction shown by an arrow Y in FIG. 5A.

The laser beam applying means 52 includes a cylindrical casing 521 extending in a substantially horizontal direction and focusing means 522 mounted on a front end of the casing 521 for focusing a pulsed laser beam. The imaging means 53 is mounted on a front end portion of the casing 521 of the laser beam applying means 52. In the present embodiment, the imaging means 53 includes an ordinary imaging device (CCD) for imaging a workpiece by using visible light, infrared light applying means for applying infrared light to the workpiece, an optical system for capturing the infrared light applied by the infrared light applying means, and an imaging device (infrared CCD) for outputting an electrical signal corresponding to the infrared light captured by the optical system. An image signal output from the imaging means 53 is transmitted to control means (not shown).

The modified layer forming step using the laser processing apparatus 5 mentioned above will now be described with reference to FIGS. 5A to 6C. First, the protective tape 3 attached to the semiconductor wafer 2 processed by the preliminary grinding step is placed on the chuck table 51 of the laser processing apparatus 5 shown in FIG. 5A. Thereafter, the electromagnetic on-off valve 513c of the suction means 513 is energized (ON) to be opened, thereby applying a vacuum to the upper surface (holding surface) of the vacuum chuck 512, so that the semiconductor wafer 2 is held under suction through the protective tape 3 on the upper surface (holding surface) of the vacuum chuck 512 (wafer holding step). Accordingly, the back side 2b of the semiconductor wafer 2 held on the chuck table 51 is oriented upward. Thereafter, the chuck table 51 holding the semiconductor wafer 2 under suction is moved to a position directly below the imaging means 53 by operating feeding means (not shown).

In the condition where the chuck table 51 is positioned directly below the imaging means 53, an alignment operation is performed by the imaging means 53 and the control means (not shown) to detect a subject area of the semiconductor wafer 2 to be laser-processed. More specifically, the imaging means 53 and the control means (not shown) perform image processing such as pattern matching for making the alignment of the streets 21 extending in a first direction on the semiconductor wafer 2 and the focusing means 522 of the laser beam applying means 52 for applying the laser beam along the streets 21, thus performing the alignment of a laser beam applying position. This alignment operation is performed similarly for the other streets 21 extending in a second direction perpendicular to the first direction mentioned above on the semiconductor wafer 2. Although the front side 2a of the semiconductor wafer 2 on which the streets 21 are formed is oriented downward, the streets 21 can be imaged from the back side 2b of the semiconductor wafer 2 through the wafer 2 because the imaging means 53 includes the infrared light applying means for applying infrared light, the optical system for capturing the infrared light, and the imaging device (infrared CCD) for outputting an electrical signal corresponding to the infrared light as mentioned above.

Figure 6A:
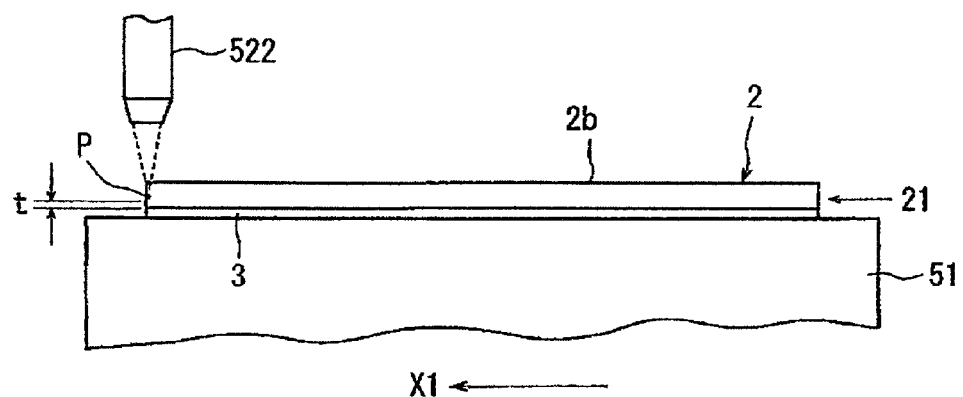
FIGS. 6A to 6C are sectional side views for illustrating the modified layer forming step.

After performing the alignment operation to detect all the streets 21 of the semiconductor wafer 2 held on the chuck table 51, the chuck table 51 is moved to a laser beam applying area where the focusing means 522 of the laser beam applying means 52 is positioned, thereby positioning a predetermined one of the streets 21 extending in the first direction below the focusing means 522. More specifically, as shown in FIG. 6A, one end (left end as viewed in FIG. 6A) of the predetermined street 21 on the semiconductor wafer 2 is positioned directly below the focusing means 522. Thereafter, a focal point P of the pulsed laser beam to be applied from the focusing means 522 is set above a position corresponding to a finished thickness (t) of each device as measured from the front side 2a (lower surface) of the semiconductor wafer 2. For example, in a case that the finished thickness (t) of each device is 50 μm, the focal point P of the pulsed laser beam is set at a height of 75 μm from the front side 2a (lower surface) of the semiconductor wafer 2. Thereafter, the pulsed laser beam having a transmission wavelength to a silicon wafer is applied from the focusing means 522 to the semiconductor wafer 2, and the feeding means (not shown) is operated to move the chuck table 51, or the semiconductor wafer 2 in the direction shown by an arrow X1 in FIG. 6A at a predetermined feed speed.

Figure 6B:
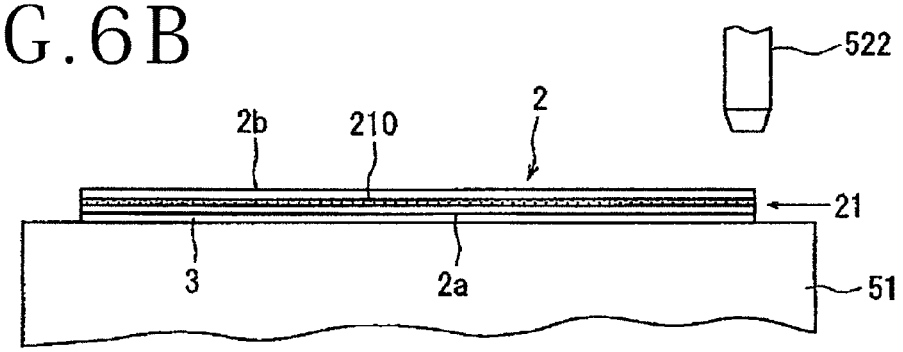
Figure 6C:
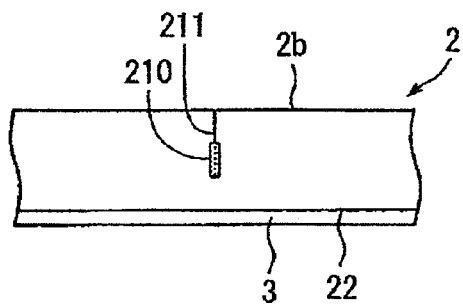

When the other end (right end as viewed in FIG. 6B) of the predetermined street 21 reaches the position directly below the focusing means 522 of the laser beam applying means 52 as shown in FIG. 6B, the application of the pulsed laser beam is stopped and the movement of the chuck table 51, or the semiconductor wafer 2 is also stopped. As a result, a modified layer 210 having a thickness of 50 μm, for example, is formed inside the semiconductor wafer 2 along the predetermined street 21 at a depth not reaching the finished thickness (50 μm, for example) as measured from the front side 2a (lower surface) of the wafer 2. This modified layer 210 is formed as a melted and rehardened layer. By performing this modified layer forming step to form the modified layer 210 inside the semiconductor wafer 2 along the predetermined street 21, a crack 211 is easily generated so as to extend from an upper end of the modified layer 210 to the back side 2b (upper surface) of the semiconductor wafer 2 as shown in FIG. 6C. However, it is difficult to generate a crack extending from a lower end of the modified layer 210 to the front side 2a (lower surface) of the semiconductor wafer 2.

For example, the modified layer forming step mentioned above is performed under the following processing conditions.

Light source: LD pumped Q-switched Nd:YVO4 pulsed laser

Wavelength: 1064 nm
Repetition frequency: 100 kHz
Average power: 1 W
Focused spot diameter: ϕ 1 μm
Work feed speed: 100 mm/s After performing the modified layer forming step along the predetermined street 21 as mentioned above, the chuck table 51 is moved in the indexing direction shown by the arrow Y in FIG. 5A by the pitch of the streets 21 (indexing step) and the modified layer forming step is similarly performed along this street 21. After performing the modified layer forming step along all of the streets 21 extending in the first direction on the semiconductor wafer 2, the chuck table 51 is rotated 90° to similarly perform the modified layer forming step along all of the other streets 21 extending in the second direction perpendicular to the first direction.

Figure 7:
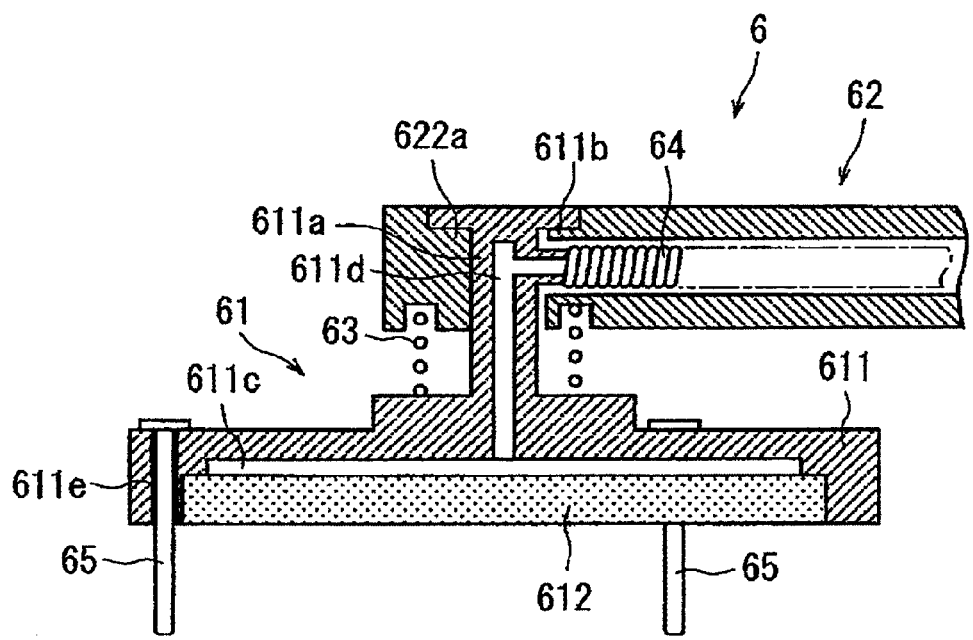
FIG. 7 is a sectional view of an essential part of transport means to be used in performing a wafer dividing step in the wafer processing method according to the present invention.

Thereafter, a wafer dividing step is performed in such a manner that suction holding of the semiconductor wafer 2 by the chuck table 51 is canceled and an air pressure is next applied to the semiconductor wafer 2 now placed on the holding surface of the chuck table 51, thereby dividing the semiconductor wafer 2 along the streets 21 where the modified layers are respectively formed, thus obtaining the individual devices. This wafer dividing step is performed as guiding the outer circumference of the semiconductor wafer 2 placed on the holding surface of the chuck table 51 by using transport means 6 shown in FIG. 7. The transport means 6 shown in FIG. 7 includes a suction holding pad 61 and an operation arm 62 for supporting the suction holding pad 61. The suction holding pad 61 is composed of a disk-shaped base 611 and a circular pad element 612. The base 611 is formed of a suitable metal material and has a central support shaft portion 611a projecting upward from an upper surface. The support shaft portion 611a is mounted at a front end portion of the operation arm 62. A flange portion 611b is formed at an upper end of the support shaft portion 611a. The flange portion 611b is engaged with a stop portion 622a formed in the operation arm 62 at the front end portion thereof. A compression coil spring 63 is provided between the upper surface of the base 611 and a lower surface of the operation arm 62 at the front end portion thereof, thereby downward biasing the base 611.

A lower surface of the base 611 constituting the suction holding pad 61 is formed with a circular recess 611c for engaging the circular pad element 612. The circular pad element 612 is formed from a porous ceramic member and it is fitted in the circular recess 611c of the base 611. A lower surface of the pad element 612 fitted in the recess 611c of the base 611 functions as a suction holding surface for holding the workpiece under suction. The recess 611c of the base 611 constituting the suction holding pad 61 is connected through a communication passage 611d formed in the support shaft portion 611a to a pipe 64 such as a flexible pipe provided in the operation arm 62. The pipe 64 is connected to suction means (not shown). Accordingly, when this suction means (not shown) is operated, a vacuum is applied through the pipe 64, the communication passage 611d, and the recess 611c of the base 611 to the lower surface (suction holding surface) of the pad element 612, so that the workpiece can be held on the lower surface (suction holding surface) of the pad element 612 under suction. Further, an outer circumferential portion of the base 611 constituting the suction holding pad 61 is formed with three guide holes 611e as vertically extending through holes at 120° intervals. Three movement limiting rods 65 are slidably inserted through the three guide holes 611e, respectively.

The wafer dividing step is performed as using the transport means 6 to limit the horizontal movement of the outer circumference of the semiconductor wafer 2 placed on the holding surface of the chuck table 51 in the following manner. As shown in FIG. 8A, lower ends of the three movement limiting rods 65 positioned outside the outer circumference of the semiconductor wafer 2 are placed on the upper surface of the chuck table 51 in the condition where suction holding of the semiconductor wafer 2 processed by the modified layer forming step has been canceled on the chuck table 51. In the condition where the horizontal movement of the semiconductor wafer 2 placed on the chuck table 51 is limited by the three movement limiting rods 65, the electromagnetic on-off valve 514c of the compressed air supplying means 514 is energized (ON) to be opened as shown in FIG. 8B. Accordingly, an air pressure is applied from the compressed air source 514a through the pneumatic line 514b, the passage 511c, and the engaging recess 511a to the upper surface (holding surface) of the vacuum chuck 512, so that this air pressure is applied to the semiconductor wafer 2 placed on the upper surface (holding surface) of the vacuum chuck 512. Since the crack 211 has already been generated so as to extend from the upper end of each modified layer 210 to the back side 2b (upper surface) of the semiconductor wafer 2, the semiconductor wafer 2 can be easily curved so as to become convex upward by the air pressure acting on the protective tape 3 attached to the front side 2a (lower surface) of the semiconductor wafer 2 as shown in FIG. 8B. As a result, a crack 212 is generated so as to extend from the lower end of each modified layer 210 to the front side 2a (lower surface) of the semiconductor wafer 2 as shown in FIG. 8C, thereby dividing the semiconductor wafer 2 along the streets 21 where the modified layers 210 are respectively formed to obtain the individual devices 22.

After performing the wafer dividing step mentioned above, the electromagnetic on-off valve 514c of the compressed air supplying means 514 is de-energized (OFF) to be closed. As a result, the semiconductor wafer 2 divided into the individual devices 22 is placed on the chuck table 51. Thereafter, the suction holding pad 61 of the transport means 6 is lowered to bring the lower surface (suction holding surface) of the pad element 612 into contact with the back side 2b (upper surface) of the semiconductor wafer 2 divided into the individual devices 22. In this condition, the suction means (not shown) is operated to hold the semiconductor wafer 2 on the lower surface (suction holding surface) of the pad element 612 under suction. Thereafter, the semiconductor wafer 2 held on the lower surface (suction holding surface) of the pad element 612 under suction is transported by the transport means 6 to a position where the next step is to be performed.

Figure 9:
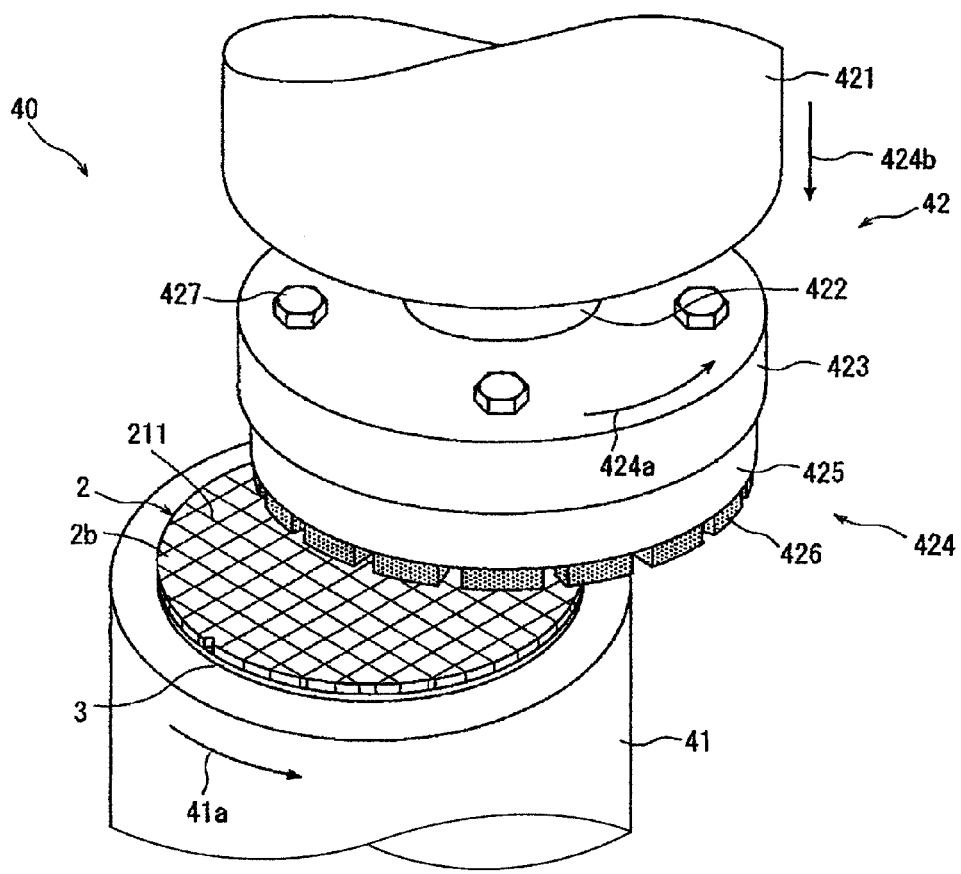
FIG. 9 is a perspective view of an essential part of a grinding apparatus for performing a modified layer removing step in the wafer processing method according to the present invention.

After performing the wafer dividing step mentioned above, a modified layer removing step is performed in such a manner that the back side of the semiconductor wafer 2 processed by the wafer dividing step is ground to reduce the thickness of the semiconductor wafer 2 to the finished thickness of each device, thereby removing the modified layers. This modified layer removing step is performed by using a grinding apparatus 40 shown in FIG. 9. The configuration of the grinding apparatus 40 shown in FIG. 9 is substantially the same as that of the grinding apparatus 4 shown in FIG. 3. Accordingly, the same members are denoted by the same reference symbols and the description thereof will be omitted herein.

Figure 10:
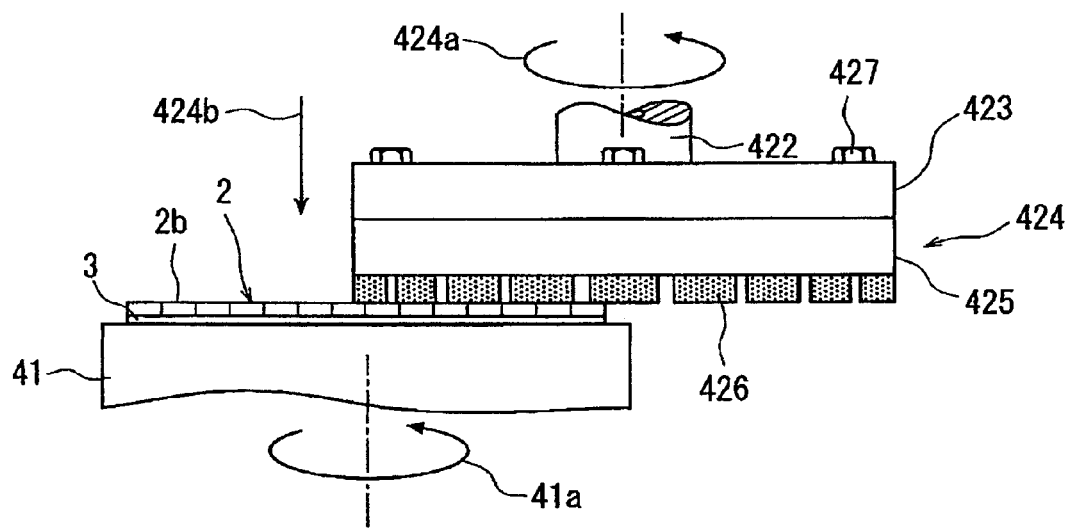
FIG. 10 is a side view for illustrating the modified layer removing step.

The modified layer removing step using the grinding apparatus 40 is performed in the following manner. As shown in FIG. 9, the protective tape 3 attached to the semiconductor wafer 2 processed by the wafer dividing step is placed on the upper surface (holding surface) of the chuck table 41. Thereafter, the suction means (not shown) is operated to hold the semiconductor wafer 2 divided into the individual devices 22 and supported by the protective tape 3 on the chuck table 41 under suction (wafer holding step). Accordingly, the back side 2b of the semiconductor wafer 2 held on the chuck table 41 is oriented upward. In the condition where the semiconductor wafer 2 divided into the individual devices 22 is held under suction on the chuck table 41 through the protective tape 3 as mentioned above, the chuck table 41 is rotated at 300 rpm, for example, in the direction shown by the arrow 41a in FIG. 9. At the same time, the grinding wheel 424 of the grinding means 42 is also rotated at 6000 rpm, for example, in the direction shown by the arrow 424a in FIG. 9. Thereafter, the grinding means 42 is lowered to bring the abrasive members 426 into contact with the back side 2b of the semiconductor wafer 2 as the work surface as shown in FIG. 10. Further, the grinding wheel 424 is fed downward (in the direction perpendicular to the holding surface of the chuck table 41) as shown by the arrow 424b in FIGS. 9 and 10 by a predetermined amount at a predetermined feed speed of 0.5 μm/s, for example. As a result, the back side 2b of the semiconductor wafer 2 divided into the individual devices 22 is ground to reduce the thickness of the semiconductor wafer 2 to the finished thickness (e.g., 50 μm). In this modified layer removing step, the semiconductor wafer 2 is ground to attain the finished thickness of 50 μm, thereby removing the modified layers 210. Further, in performing the modified layer removing step, the individual devices 22 divided from each other are kept attached to the protective tape 3 to maintain the form of the semiconductor wafer 2.

Figure 11A:
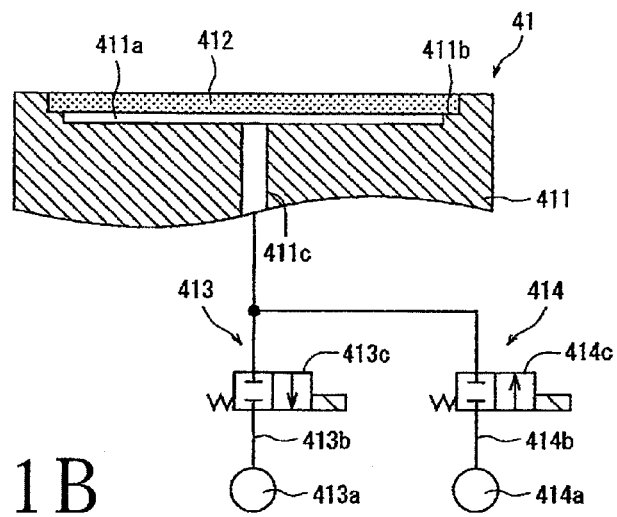
FIGS. 11A to 11D are views for illustrating another preferred embodiment of the wafer dividing step.

Another preferred embodiment of the present invention will now be described. In the above preferred embodiment shown in FIGS. 1 to 10, the wafer dividing step is performed on the chuck table 51 of the laser processing apparatus 5 used in performing the modified layer forming step. In contrast thereto, another preferred embodiment is characterized in that the wafer dividing step is performed on the chuck table 41 of the grinding apparatus 40 to be used in performing the modified layer removing step. Accordingly, in this preferred embodiment, the chuck table 41 of the grinding apparatus 40 is similar in configuration to the chuck table 51 of the laser processing apparatus 5. As shown in FIG. 11A, the chuck table 41 is composed of a solid cylindrical body 411 and a vacuum chuck 412 provided on an upper surface of the body 411. The vacuum chuck 412 is formed from a porous ceramic member having air permeability. The body 411 is formed of a metal material such as stainless steel. The upper surface of the body 411 is formed with a circular engaging recess 411a for engaging the vacuum chuck 412. An outer circumference of a bottom surface of the engaging recess 411a is formed with an annular mounting portion 411b for mounting the vacuum chuck 412 thereon. Further, the body 411 is formed with a passage 411c opening to the engaging recess 411a. The passage 411c of the body 411 of the chuck table 41 is connected to suction means 413 and compressed air supplying means 414.

The suction means 413 is composed of a vacuum source 413a, a pneumatic line 413b for connecting the vacuum source 413a and the passage 411c, and an electromagnetic on-off valve 413c provided in the pneumatic line 413b. When the electromagnetic on-off valve 413c is in a de-energized condition (OFF), the valve 413c is kept closed, whereas when energized (ON), the valve 413c is opened. Accordingly, when the electromagnetic on-off valve 413c is energized (ON) to be opened, a vacuum is applied from the vacuum source 413a through the pneumatic line 413b, the passage 411c, and the engaging recess 411a to an upper surface (holding surface) of the vacuum chuck 412, thereby holding the workpiece on the upper surface (holding surface) of the vacuum chuck 412 under suction. On the other hand, the compressed air supplying means 414 is composed of a compressed air source 414a, a pneumatic line 414b for connecting the compressed air source 414a and the passage 411c, and an electromagnetic on-off valve 414c provided in the pneumatic line 414b. When the electromagnetic on-off valve 414c is in a de-energized condition (OFF), the valve 414c is kept closed, whereas when energized (ON), the valve 414c is opened. Accordingly, when the electromagnetic on-off valve 414c is energized (ON) to be opened, an air pressure is applied from the compressed air source 414a through the pneumatic line 414b, the passage 411c, and the engaging recess 411a to the upper surface (holding surface) of the vacuum chuck 412, thereby applying the air pressure to the workpiece placed on the upper surface (holding surface) of the vacuum chuck 412.

Figure 11B:
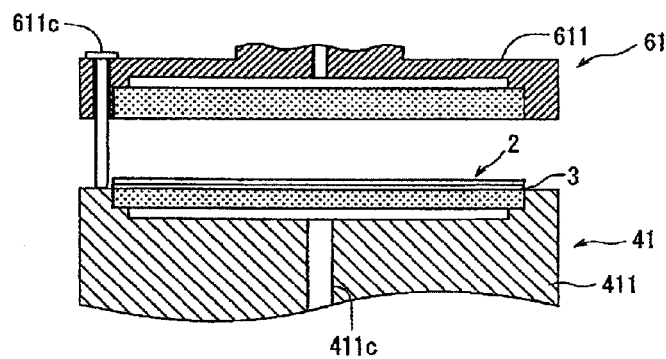
Figure 11C:
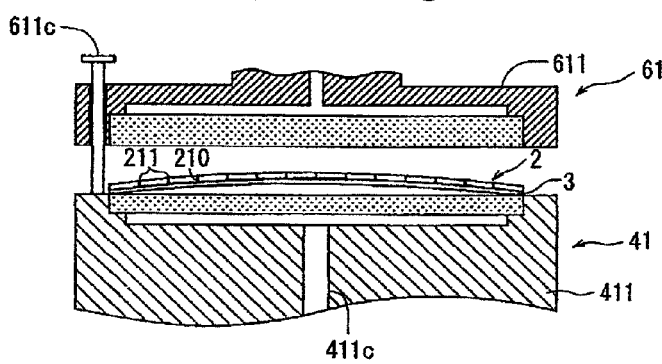
Figure 11D:
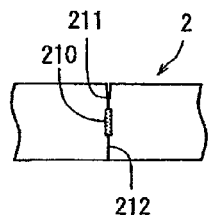

The wafer dividing step is performed on the chuck table 41 of the grinding apparatus 40 in the following manner. First, the semiconductor wafer 2 held under suction on the lower surface (suction holding surface) of the suction holding pad 61 of the transport means 6 after performing the modified layer forming step is transported to the chuck table 41. Thereafter, suction holding of the semiconductor wafer 2 by the suction holding pad 61 is canceled and the suction holding pad 61 is raised by a predetermined distance as shown in FIG. 11B. As a result, the semiconductor wafer 2 on the chuck table 41 is limited in horizontal movement by the three movement limiting rods 65. Thereafter, the electromagnetic on-off valve 414c of the compressed air supplying means 414 is energized (ON) to be opened. Accordingly, an air pressure is applied from the compressed air source 414a through the pneumatic line 414b, the passage 411c, and the engaging recess 411a to the upper surface (holding surface) of the vacuum chuck 412, so that this air pressure is applied to the semiconductor wafer 2 placed on the upper surface (holding surface) of the vacuum chuck 412. Since the crack 211 has already been generated so as to extend from the upper end of each modified layer 210 to the back side 2b (upper surface) of the semiconductor wafer 2, the semiconductor wafer 2 can be easily curved so as to become convex upward by the air pressure acting on the protective tape 3 attached to the front side 2a (lower surface) of the semiconductor wafer 2 as shown in FIG. 11C. As a result, a crack 212 is generated so as to extend from the lower end of each modified layer 210 to the front side 2a (lower surface) of the semiconductor wafer 2 as shown in FIG. 11D, thereby dividing the semiconductor wafer 2 along the streets 21 where the modified layers 210 are respectively formed to obtain the individual devices 22.

After performing the wafer dividing step mentioned above, the electromagnetic on-off valve 414c of the compressed air supplying means 414 is de-energized (OFF) to be closed. As a result, the semiconductor wafer 2 divided into the individual devices 22 is placed on the chuck table 41. Thereafter, the electromagnetic on-off valve 413c of the suction means 413 is energized (ON) to be opened, thereby applying a vacuum from the vacuum source 413a through the pneumatic line 413b, the passage 411c, and the engaging recess 411a to the upper surface (holding surface) of the vacuum chuck 412, so that the semiconductor wafer 2 divided into the individual devices 22 is held under suction through the protective tape 3 on the upper surface (holding surface) of the vacuum chuck 412. In this condition, the modified layer removing step using the grinding apparatus 40 is performed as mentioned above.

Figure 12:
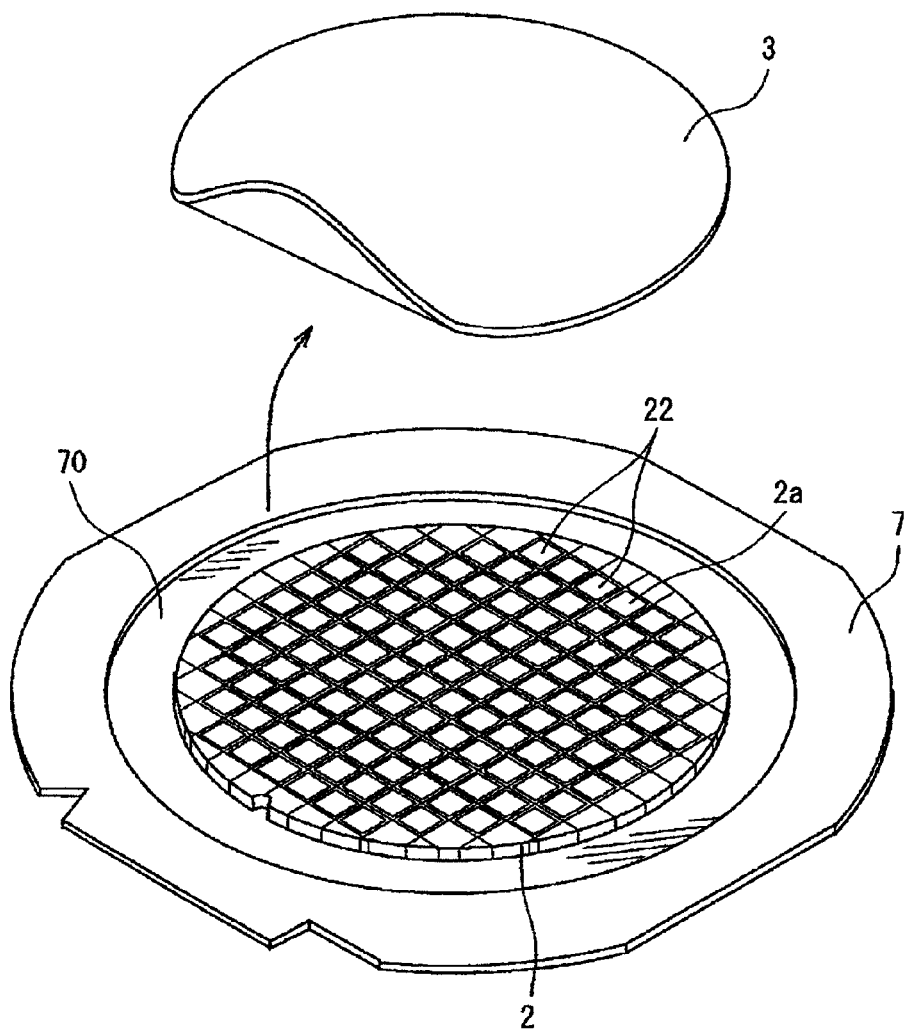
FIG. 12 is a perspective view for illustrating a wafer transfer step in the wafer processing method according to the present invention.

After performing the modified layer removing step mentioned above, a wafer transfer step is performed in such a manner that the back side of the semiconductor wafer 2 is attached to an expansible adhesive tape supported to an annular frame and the protective tape 3 is next peeled from the front side of the semiconductor wafer 2. More specifically, as shown in FIG. 12, the back side 2b of the semiconductor wafer 2 divided into the individual devices 22 is attached to an expansible adhesive tape 70 supported to an annular frame 7 in the condition where the protective tape 3 is kept attached to the front side 2a of the semiconductor wafer 2. Accordingly, the protective tape 3 attached to the front side 2a of the semiconductor wafer 2 is oriented upward. Thereafter, the protective tape 3 is peeled from the front side 2a of the semiconductor wafer 2 as shown in FIG. 12.

Figure 13:
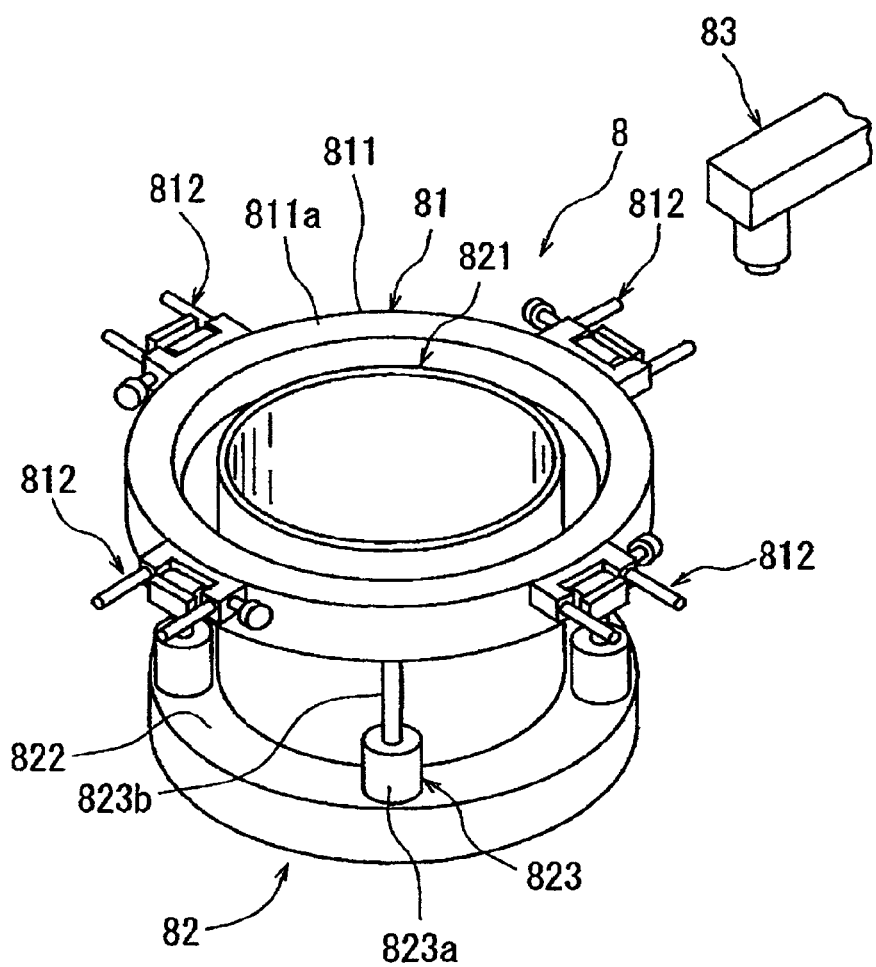
FIG. 13 is a perspective view of a pickup apparatus for performing a pickup step in the wafer processing method according to the present invention.

After performing the wafer transfer step mentioned above, a pickup step is performed to pick up each device 22 divided from the semiconductor wafer 2 attached to the expansible adhesive tape 70 supported to the annular frame 7. This pickup step is performed by using a pickup apparatus 8 shown in FIG. 13. The pickup apparatus 8 shown in FIG. 13 includes frame holding means 81 for holding the annular frame 7, tape expanding means 82 for expanding the adhesive tape 70 supported to the annular frame 7 held by the frame holding means 81, and a pickup collet 83. The frame holding means 81 includes an annular frame holding member 811 and a plurality of clamps 812 as fixing means provided on the outer circumference of the frame holding member 811. The upper surface of the frame holding member 811 functions as a mounting surface 811a for mounting the annular frame 7 thereon. The annular frame 7 mounted on the mounting surface 811a is fixed to the frame holding member 811 by the clamps 812. The frame holding means 81 is supported by the tape expanding means 82 so as to be vertically movable.

Figure 14A:
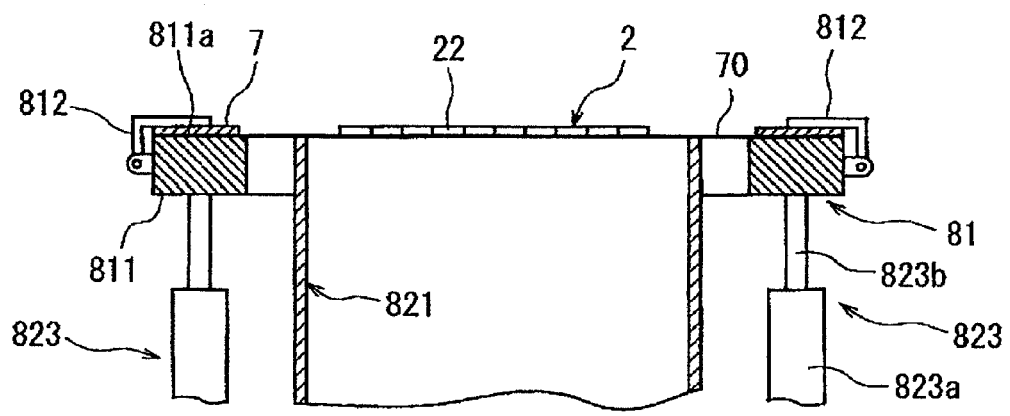
FIGS. 14A and 14B are sectional side views for illustrating the pickup step.

The tape expanding means 82 includes an expanding drum 821 provided inside of the annular frame holding member 811. The expanding drum 821 has an outer diameter smaller than the inner diameter of the annular frame 7 and an inner diameter larger than the outer diameter of the semiconductor wafer 2 attached to the adhesive tape 70 supported to the annular frame 7. The expanding drum 821 has a supporting flange 822 at the lower end of he drum 821. The tape expanding means 82 further includes supporting means 823 for vertically movably supporting the annular frame holding member 811. The supporting means 823 is composed of a plurality of air cylinders 823a provided on the supporting flange 822. Each air cylinder 823a is provided with a piston rod 823b connected to the lower surface of the annular frame holding member 811. The supporting means 823 composed of these plural air cylinders 823a functions to vertically move the annular frame holding member 811 so as to selectively take a reference position where the mounting surface 811a is substantially equal in height to the upper end of the expanding drum 821 as shown in FIG. 14A and an expansion position where the mounting surface 811a is lower in height than the upper end of the expanding drum 821 by a predetermined amount as shown in FIG. 14B.

The pickup step using the pickup apparatus 8 will now be described with reference to FIGS. 14A and 14B. As shown in FIG. 14A, the annular frame 7 supporting the semiconductor wafer 2 through the adhesive tape 70 in the condition where the semiconductor wafer 2 has already been divided into the individual devices 22 is mounted on the mounting surface 811a of the frame holding member 811 of the frame holding means 81 and fixed to the frame holding member 811 by the clamps 812 (frame holding step). At this time, the frame holding member 811 is set at the reference position shown in FIG. 14A. Thereafter, the air cylinders 823a as the supporting means 823 of the tape expanding means 82 are operated to lower the frame holding member 811 to the expansion position shown in FIG. 14B. Accordingly, the annular frame 7 fixed to the mounting surface 811a of the frame holding member 811 is also lowered, so that the adhesive tape 70 supported to the annular frame 7 comes into abutment against the upper end of the expanding drum 821 and is expanded as shown in FIG. 14B (tape expanding step). As a result, the spacing S between any adjacent ones of the individual devices 22 is increased because the semiconductor wafer 2 attached to the adhesive tape 70 has already been divided into the individual devices 22 along the streets 21.

Figure 14B:
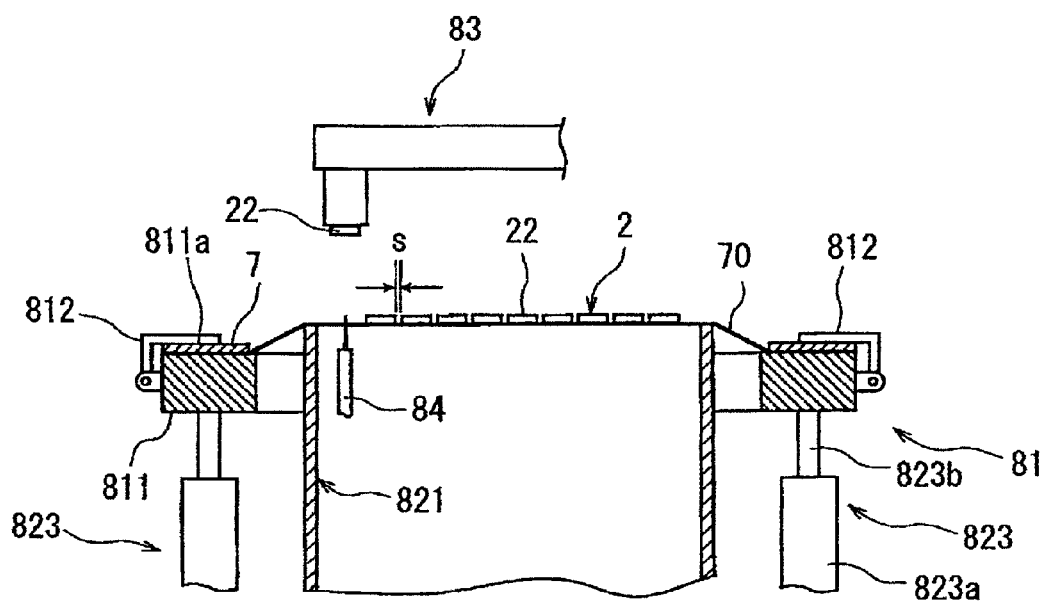

Thereafter, the pickup collet 83 is operated to hold each device 22 under suction and peel it from the adhesive tape 70, thus individually picking up the devices 22 as shown in FIG. 14B. At this time, a push pin 84 is used to push up each device 22 from the lower side of the adhesive tape 70 as shown in FIG. 14B, so that each device 22 can be easily peeled from the adhesive tape 70. This push pin 84 acts on the back side of each device 22 to push up each device 22, so that there is no possibility of damage to the front side of each device 22. Further, in this pickup step, the spacing S between any adjacent ones of the individual devices 22 is increased, so that each device 22 can be easily picked up without the contact with its adjacent device 22. Further, the front side (upper surface) of each device 22 is held under suction by the pickup collet 83, so that it is not necessary to reverse each device 22 in the subsequent step. In each device 22 thus manufactured above, no modified layer is left on the side surface of each device 22, so that a die strength is improved 1.5 times or more.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of dividing a wafer along a plurality of crossing streets formed on a front side of said wafer to thereby partition a plurality of regions where a plurality of devices are respectively formed, said wafer processing method comprising:
a protective tape attaching step of attaching a protective tape to the front side of said wafer;
a laser processing apparatus preparing step of preparing a laser processing apparatus including a chuck table having a holding surface for holding said wafer, said holding surface being adapted to selectively receive a vacuum and an air pressure;
a modified layer forming step of placing said protective tape attached to said wafer on said holding surface of said chuck table of said laser processing apparatus, next applying the vacuum to said holding surface to thereby hold said wafer through said protective tape on said holding surface under suction, and next applying a laser beam having a transmission wavelength to said wafer from a back side of said wafer along said streets, thereby forming a modified layer inside said wafer along each street at a depth not reaching a finished thickness of each device as measured from the front side of said wafer;
a wafer dividing step of canceling suction holding of said wafer by said chuck table and next applying the air pressure through said holding surface to said wafer now placed on said holding surface in the condition where horizontal movement of said wafer is limited, thereby dividing said wafer along each street where said modified layer is formed, thus obtaining the individual devices; and
a modified layer removing step of grinding the back side of said wafer after performing said wafer dividing step to reduce the thickness of said wafer to the finished thickness of each device, thereby removing said modified layer.

2. The wafer processing method according to claim 1, further comprising a preliminary grinding step of grinding the back side of said wafer after performing said protective tape attaching step and before performing said modified layer forming step to reduce the thickness of said wafer to a predetermined thickness allowing proper formation of said modified layer in said modified layer forming step.

3. A wafer processing method of dividing a wafer along a plurality of crossing streets formed on a front side of said wafer to thereby partition a plurality of regions where a plurality of devices are respectively formed, said wafer processing method comprising:
a protective tape attaching step of attaching a protective tape to the front side of said wafer;
a modified layer forming step of applying a laser beam having a transmission wavelength to said wafer from a back side of said wafer along said streets, thereby forming a modified layer inside said wafer along each street at a depth not reaching a finished thickness of each device as measured from the front side of said wafer;
a grinding apparatus preparing step of preparing a grinding apparatus including a chuck table having a holding surface for holding said wafer, said holding surface being adapted to selectively receive a vacuum and an air pressure;
a wafer dividing step of placing said protective tape attached to said wafer on said holding surface of said chuck table of said grinding apparatus and next applying the air pressure through said holding surface to said wafer placed on said holding surface in the condition where horizontal movement of said wafer is limited, thereby dividing said wafer along each street where said modified layer is formed, thus obtaining the individual devices; and
a modified layer removing step of applying the vacuum to said holding surface of said chuck table of said grinding apparatus after performing said wafer dividing step to thereby hold said wafer through said protective tape on said holding surface under suction and next grinding the back side of said wafer to reduce the thickness of said wafer to the finished thickness of each device, thereby removing said modified layer.

4. The wafer processing method according to claim 3, further comprising a preliminary grinding step of grinding the back side of said wafer after performing said protective tape attaching step and before performing said modified layer forming step to reduce the thickness of said wafer to a predetermined thickness allowing proper formation of said modified layer in said modified layer forming step.

* * * * *